United States Patent [19]

Wong

[11] Patent Number: 4,878,033

[45] Date of Patent: Oct. 31, 1989

[54] LOW NOISE MICROWAVE AMPLIFIER HAVING OPTIMAL STABILITY, GAIN, AND NOISE CONTROL

[75] Inventor: Joseph S. Wong, Upland, Calif.

[73] Assignee: Hughes Aircraft Company, Los Angeles, Calif.

[21] Appl. No.: 232,728

[22] Filed: Aug. 16, 1988

[51] Int. Cl.[4] .............................................. H03F 3/16
[52] U.S. Cl. .................................... 330/277; 330/286
[58] Field of Search ............... 330/109, 149, 277, 286, 330/294, 307, 300, 302, 303, 304, 305, 306; 331/116 FE, 117 FE

[56] References Cited

U.S. PATENT DOCUMENTS

Re. 32,132  4/1986  Nakamura et al. ............. 330/277 X

FOREIGN PATENT DOCUMENTS 0109003  8/1980  Japan ............................ 331/116 FE

OTHER PUBLICATIONS

Riml, Peter, "13 cm GaAsFET Preamp", *QST*, Aug. 1984, p. 65.

Primary Examiner—Steven Mottola
Attorney, Agent, or Firm—Thomas A. Runk; Wanda K. Denson-Low

[57] ABSTRACT

A gallium arsenide MESFET amplifier circuit employing a parallel feedback network having first and second transmission line section filtering networks connected on either side of a series R-C-R circuit. In one optimized embodiment, the transmission line sections each include low and high impedances unequal in length to one-quarter wavelength. The use of two discrete resistors, together with the filtering networks to eliminate thermal noise generated by the resistors, provides optimum gain, low noise, and stable operation over a wide range of microwave frequencies.

15 Claims, 3 Drawing Sheets

LOW NOISE MICROWAVE AMPLIFIER HAVING OPTIMAL STABILITY, GAIN, AND NOISE CONTROL

The Government has rights in this invention pursuant to Contract No. 84*I*167710 awarded by the U.S. Government.

BACKGROUND OF THE INVENTION

1. Field of the Invention

The subject invention relates to electronic amplifiers, and more particularly, to a low noise gallium arsenide (GaAs) field effect transistor microwave amplifier.

2. Description of the Prior Art

As presently known, GaAs metal semiconductor field effect transistors (MESFETS) provide the lowest noise figure and are the best devices for low noise microwave amplifier applications. In such applications, a noise figure of 2.0 dB or less may be specified for particular frequencies. A drawback of present GaAs MESFET devices is that they are extremely reflective, i.e., have a very high reflection coefficient, and hence are very unstable, i.e., readily oscillate. In the design of a low noise amplifier, it is desirable to stabilize the GaAs MESFET, while retaining its intrinsic low noise characteristic.

As is well-known, amplifier stability is governed by a stability factor K. For an amplifier to be unconditionally stable its stability factor K must be kept higher than 1 in a wide frequency range. Currently, the stabilizing networks employed in the prior art do not provide both low noise operation and unconditional stability at the same time.

The prior art approaches have employed both resistive parallel feedback and resistive-capacitive parallel feedback stabilizing networks in GaAs amplifier circuits. The resistive-capacitive parallel feedback preserves the low noise characteristic of the device, but results in poor stability. Resistive-parallel feedback provides some stability, but the noise figure is an order of magnitude higher than resistive-capacitive parallel feedback.

SUMMARY OF THE INVENTION

Accordingly, it is an object of the invention to improve microwave amplifiers;

It is another object of the invention to improve microwave amplifiers employing GaAs field effect transistors; and It is another object of the invention to provide a GaAs MESFET amplifier design which exhibits both a very low noise figure, e.g., less than 2.0 dB, and stability over a very wide range of microwave frequencies.

These and other objects and advantages are achieved according to the invention by provision of a parallel feedback network for a GaAs field effect transistor amplifier including a resistor-capacitor-resistor (R-C-R) series arrangement. The use of separate resistors itself in the R-C-R series arrangement contributes to improved circuit performance. To further optimize performance, the R-C-R series circuit is used in conjunction with a filtering means for attenuating noise generated by the resistors. Preferably, the filtering means is implemented by disposing the R-C-R series arrangement between a set of filtering circuits, which are disposed at opposite ends of the feedback loop. The invention provides the ability to simultaneously and optimally control stability, gain and noise, parameters which frequently interact and have proven difficult to control in low noise microwave amplifier design.

It has been found that, by employing an R-C-R series circuit with suitable filtering means, the amplifier stability factor can be kept higher than 1 over a multioctave frequency range without destroying the intrinsic low noise characteristic or gain of the GaAs device. It is possible, for example, to achieve a stability factor of higher than 1 over a range of frequencies from 1 to 18 gigahertz (GHz) using an R-C-R arrangement with a filter means as hereafter disclosed.

BRIEF DESCRIPTION OF THE DRAWINGS

The preferred embodiment of the just-summarized invention will now be described in detail in conjunction with the drawings of which.

DETAILED DESCRIPTION OF THE PREFERRED EMBODIMENTS

Figure 1:
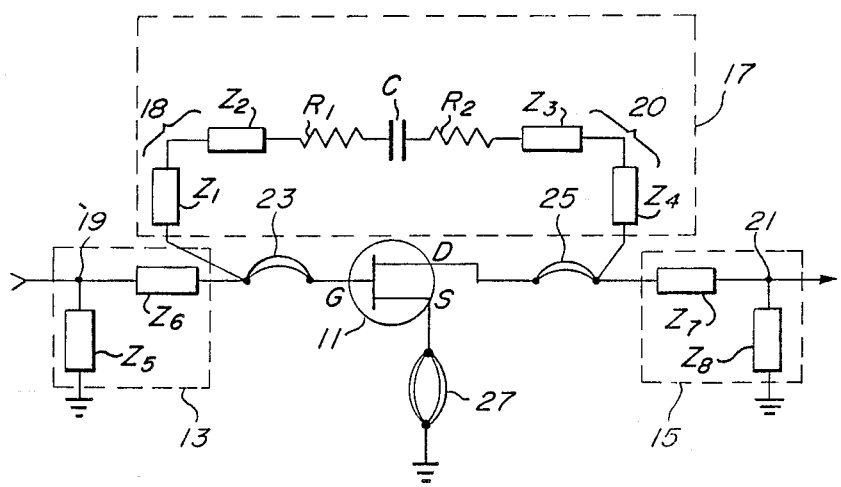
FIG. 1 is a circuit schematic diagram of the preferred embodiment of the invention.

FIG. 1 illustrates a low noise amplifier employing a GaAs MESFET 11 and R-C-R parallel feedback in accordance with the preferred embodiment of the invention. The amplifier includes input and output RF matching circuits 13, 15, the GaAs MESFET 11, and the parallel feedback loop 17. The MESFET 11 has terminals comprising a gate G, a drain D and a source S, the source S being shown connected to RF ground through bond wires 27. The MESFET 11 may be an NE 71000 as manufactured by NEC Corporation.

The input RF matching circuit 13 includes a transmission line (TRL) element $Z_6$ and a TRL element $Z_5$. The TRL element $Z_6$ is connected at one terminal through bond wires 23 to the gate G of the MESFET 11. A second terminal of the TRL element $Z_6$ provides the input 19 to the amplifier and is also connected to a first terminal of the TRL element $Z_5$, the other terminal of which is connected to DC ground.

The output RF matching circuit 15 includes a TRL element $Z_7$ connected by bonding wires 25 to the drain D of the MESFET 11. The second terminal of the TRL element $Z_7$ provides the output 21 of the amplifier. The TRL element $Z_8$ is connected at a first terminal to the output terminal 21 and is connected to RF ground at its second terminal.

The RF matching circuits 13, 15 are standard matching circuits with their values chosen to match the input and output impedances of the MESFET 11, respectively. While the circuits 13, 15 shown are "L" type matching circuits, other configurations could be used, such as "T" or "$\pi$" matching circuits.

The parallel feedback loop 17 includes two filtering networks 18, 20, each of which includes a pair of transmission line elements. The first filtering network 18 comprises TRL elements $Z_1$ and $Z_2$, while the second filtering network 20 comprises third and fourth TRL elements $Z_3$, $Z_4$.

As shown, one terminal of the TRL element $Z_2$ is connected to a first resistor $R_1$, and one terminal of the TRL element $Z_3$ is connected to a second resistor $R_2$. A capacitor C is connected serially between the first and second resistors $R_1$, $R_2$ to complete the parallel feedback network 17. Thus, the parallel feedback network 17 includes the first filtering network 18 in series with an R-C-R series circuit, in turn connected in series with the second filtering network 20.

The resistor-capacitor-resistor ($R_1$-C-$R_2$) circuitry in between the filters 18, 20 provides amplifier stabilization and gain adjustment. The two resistors $R_1$, $R_2$ arranged in the R-C-R configuration aid each other in keeping the amplifier stability factor K from falling below 1 across a multioctave frequency range as wide as 1 to 18 GHz. Computer simulations show that removing either one of the two resistors $R_1$, $R_2$ from the circuit of FIG. 1 will immediately lower the stability factor K.

The resistors $R_1$, $R_2$ generate thermal noise which, if uncompensated, would detract from noise performance. Accordingly, the filtering networks 18, 20 are used to attenuate the noise generated in the feedback loop 17 to minimize the noise added into the device noise figure of the transistor 11. The filters 18, 20 themselves are standard microwave quarter-wave transmission line section filters. Two transmission line sections in each filter 18, 20 have been found to provide sufficient noise rejection in the preferred embodiment.

Computer optimization of the circuit of FIG. 1 may be employed to optimize the amplifier for desired stability, gain and noise figure simultaneously. Optimization may be achieved by selecting initial component values for each element $Z_1$, $Z_2$, $Z_3$, $Z_4$, $R_1$, $R_2$, C of the feedback loop 17, placing limits on the variation in values of those elements, and causing a computer to vary the values within the limits set to select an optimum combination. The Touchstone (TM) software available from EESOF, Westlake Village, Calif. may be used for this purpose, such use being within the skill of those of ordinary skill in the art. Defining the limits of a resistance value and a capacitance value for gain adjustment and stabilization of a GaAs microwave amplifier is also within the skill of those ordinarily skilled in the art. According to the invention, it has been found that splitting the resistance value into two physically discrete resistors $R_1$, $R_2$ in R-C-R fashion contributes to improved stability.

As mentioned, the TRL elements $Z_1$, $Z_2$, $Z_3$ and $Z_4$ are initially selected as one-quarter wavelength transmission line sections, the wavelength being determined, as known in the art, by a selected center frequency of operation. It is found through optimization that better performance is achieved in the design described in connection with FIG. 2 when the TRL elements $Z_1$, $Z_2$, $Z_3$ and $Z_4$ are slightly unequal to one-quarter wavelength. Accordingly, in the embodiment of FIG. 2, the impedance of the TRL element $Z_1$ is selected by optimization to be higher than the TRL element $Z_2$, and at the same time the transmission line elements $Z_1$ and $Z_2$, after optimization, are each chosen to be unequal to one-quarter wavelength. Similarly, in the second filtering network 20 of FIG. 2, the TRL element $Z_4$ is selected by optimization to be a lower impedance than the TRL element $Z_3$, and the TRL elements $Z_3$, $Z_4$ after optimization are selected to be unequal to one-quarter wavelength. In other applications, for example, using a different transistor, optimization may dictate different relationships between the length and the impedance values of the TRL element pairs $Z_1$, $Z_2$ and $Z_3$, $Z_4$.

Figure 2:
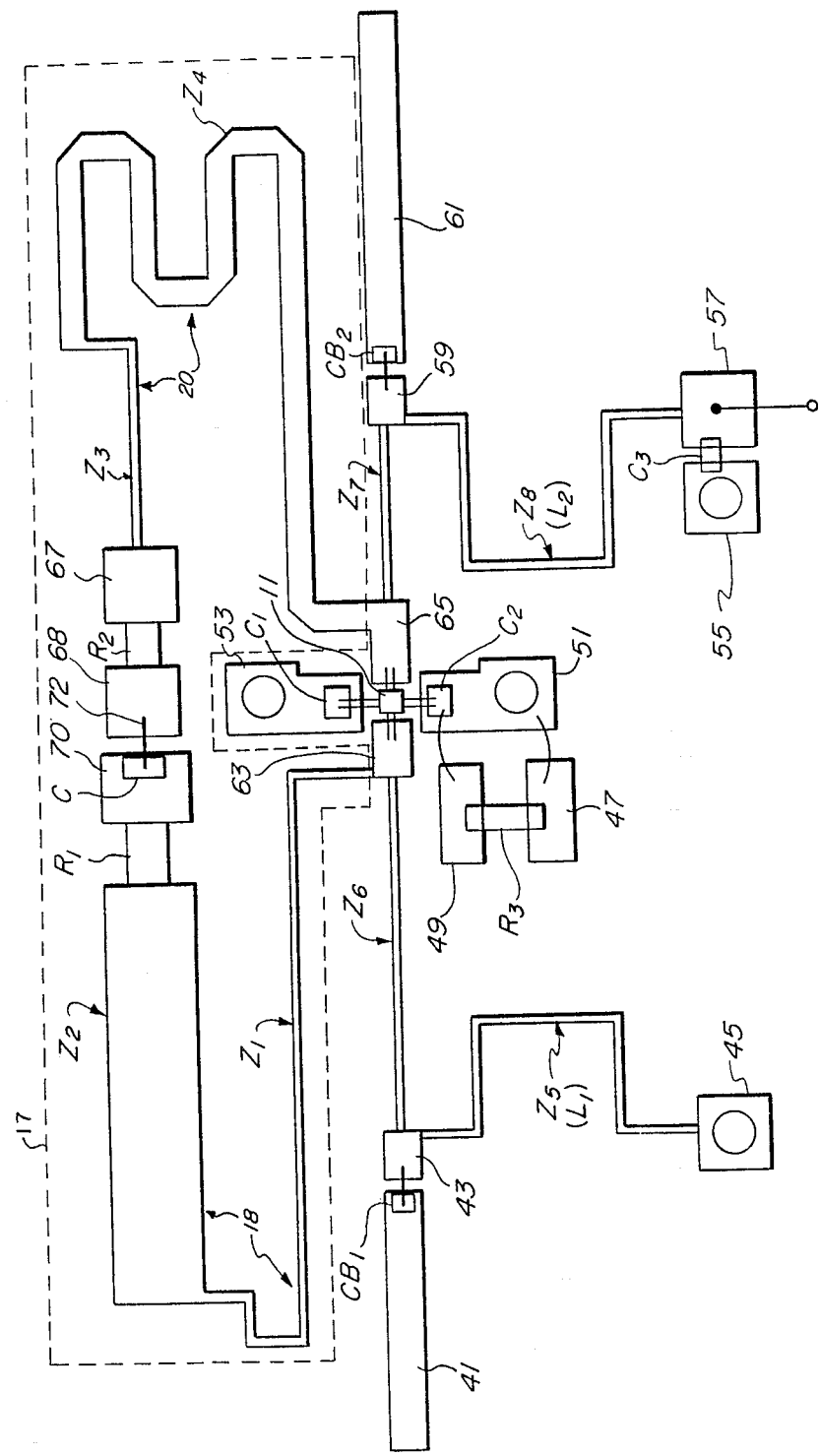
FIG. 2 is a microstrip layout of the preferred embodiment.

FIG. 2 illustrates a thin film microwave distributed integrated circuit layout of a GaAs MESFET amplifier constructed according to the preferred embodiment to provide a noise figure of 2.0 or less in the S-band frequency range. As is known in the art, such circuits typically are fabricated of gold or another suitable conductor deposited on an alumina substrate. In the embodiment of FIG. 2, the resistor $R_1$ has the value of 1,000 ohms, the capacitor C has the value of 33 picofarads, and the resistor $R_2$ has the value of 300 ohms. Removal of either resistor $R_1$ or $R_2$ from the circuit will result in the stability factor falling below 1 at some frequencies in the 1 to 18-GHz range.

The transmission line elements $Z_1$-$Z_8$ are preferably fabricated of gold deposited on 0.025-inch (0.0635 cm) thick alumina. By appropriately transforming the impedances into microstrip lines, the lengths and widths of the filter TRL elements $Z_1$, $Z_2$, $Z_3$ and $Z_4$ and the remaining TRL elements $Z_5$-$Z_8$ may be determined. The following table shows the respective length and width of each of the transmission line elements $Z_1$-$Z_8$ for a microstrip circuit (FIG. 2) constructed on a 0.025-inch (0.0635 cm) thick alumina (dielectric constant $\epsilon_r = 9.8$) substrate and operating at the center frequency of 2 GHz (wavelength $\lambda = 2.312$ inches):

| Symbol | Value (ohms) | Line Length (inches) | Line Width (inches) |
| --- | --- | --- | --- |
| $Z_1$ | 89 | .522 (1.326 cm) | .005 (.0127 cm) |
| $Z_2$ | 28 | .370 (.940 cm) | .064 (.163 cm) |
| $Z_3$ | 89 | .140 (.356 cm) | .005 (.0127 cm) |
| $Z_4$ | 57 | .836 (2.123 cm) | .018 (.0457 cm) |
| $Z_5$ | 89 | .328 (.833 cm) | .005 (.0127 cm) |
| $Z_6$ | 89 | .236 (.599 cm) | .005 (.0127 cm) |
| $Z_7$ | 89 | .119 (.302 cm) | .005 (.0127 cm) |
| $Z_8$ | 89 | .392 (.996 cm) | .005 (.0127 cm) |

Additional elements of the circuit shown in FIG. 2 include the input DC blocking capacitor $CB_1$ located in between conductors 41 and 43 and the output DC blocking capacitor $CB_2$ located between conductors 59 and 61. Conductor pads 67, 68 and 70, each $0.050 \times 0.050$ inch ($0.127 \times 0.127$ cm) square, are used to connect the thin film resistor $R_1$, the chip capacitor C and the thin film resistor $R_2$ to the transmission line sections $Z_2$ and $Z_3$ of filters 18 and 20 in the feedback loop, completing the R-C-R portion of the feedback loop 17.

Figure 3:
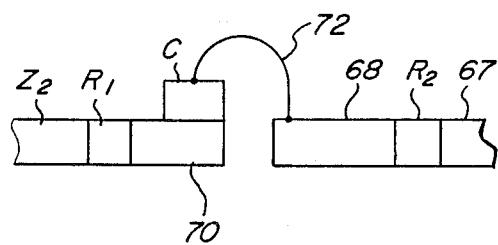
FIG. 3 is a microstrip cross-sectional view of the R-C-R feedback arrangement of FIG. 2.

FIG. 3 shows a microstrip cross-sectional view of the interconnection of the R-C-R stabilization network shown in FIG. 2. As seen, the thin film chip resistor $R_1$ is connected between the TRL element $Z_2$ and the conductor pad 70. A wire bond 72 is made to the chip capacitor C mounted on top of the conductor pad 70. The thin film chip resistor $R_2$ is connected between the conductor pad 68 and the conductor pad 67.

FIG. 2 further illustrates a number of grounding pads 45, 51, 53, 55 and conductor pads 47, 49, 57, 63, 65, which are provided to ground and interconnect various circuit elements. The TRL element $Z_5$, which has an equivalent inductance denoted $L_1$, is grounded by the ground pad 45. A chip capacitor $C_1$ is connected to the source of the MESFET 11 and is grounded at one terminal by the ground pad 53. A chip capacitor $C_2$ connected to the same source is mounted on the ground pad 51 and connected by a bond wire to the conductor pad 49. A thin film chip resistor $R_3$ is connected between the two conductor pads 49, 47 and effectively grounded by a bond wire connection to the ground pad 51. The TRL element $Z_8$, which has an equivalent inductance denoted $L_2$, is connected at one terminal to conductor pad 59 and at the other terminal to the conductor pad 57. A chip capacitor $C_3$ is connected from the conductor pad 57 to the ground pad 55. It may be noted that the grounding pads 45, 51, 53, 55 and conductor pads 47, 49, 57, 63, 65 are also preferably constructed of gold deposited on alumina, as known in the art.

Figure 4:
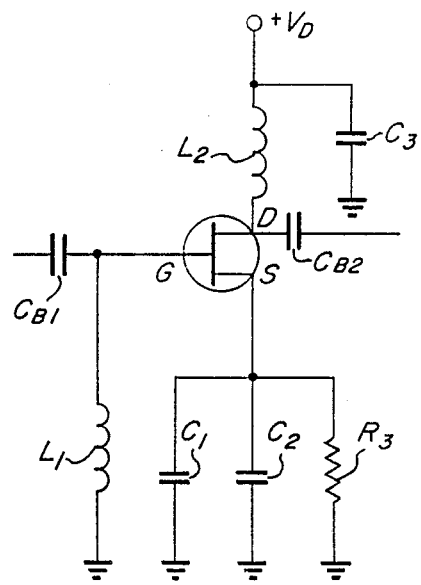
FIG. 4 is a circuit diagram of the transistor DC bias circuit.

FIG. 4 illustrates the D.C. bias circuit for the MESFET 11. The gate G of the MESFET 11 is coupled to the input blocking capacitor $CB_1$ and to ground through the inductance $L_1$. The source S of the MESFET 11 is commonly connected to the capacitors $C_1$, $C_2$ and the resistor $R_3$. The opposite terminals of these elements $C_1$, $C_2$, $R_3$ are grounded. The drain D of the MESFET 11 is fed by a bias voltage source $V_d$ through the inductance $L_2$ (which functions as a choke) and is serially connected to an output blocking capacitor $CB_2$. The bypass capacitor $C_3$ connects between the source voltage $V_D$ and ground. Design of a biasing circuit such as that of FIG. 4 is well within the skill of those of ordinary skill in the art.

Figure 5:
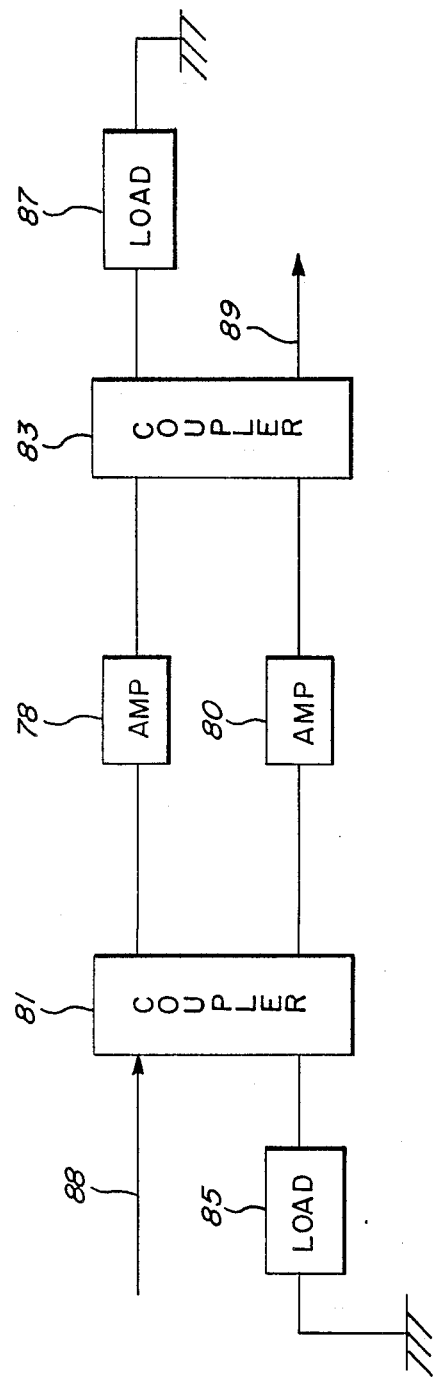
FIG. 5 is a circuit block diagram showing amplifiers according to the preferred embodiment in a microwave circuit employing hybrid couplers.

Since the amplifier described above has low noise but only a moderate voltage standing wave ratio (VSWR) (<2.0:1), a circuit such as shown in FIG. 5 may be employed in a system where both a low VSWR and a good noise figure are required. According to FIG. 5, two amplifiers 78, 80, each constructed like that of FIG. 1 or FIG. 2, are connected in a microwave circuit with hybrid couplers 81, 83. Aside from the employment of amplifiers 78, 80 designed according to the invention, the circuit of FIG. 5 is a conventional hybrid circuit.

In FIG. 5, the hybrid couplers 81, 83 preferably comprise 3-dB Lange couplers, as well known in the art. The input to the circuit of FIG. 5 is at a first terminal 88 of the input coupler 81. The second terminal of the input coupler 81 is grounded through a 50-ohm load 85, as known in the art. Similarly, the output coupler 83 has one terminal grounded through a 50-ohm load 87 and a second terminal forming the output terminal 89 of the circuit. The first and second amplifiers 78, 80 according to the preferred embodiment are connected between the terminals of the two couplers 81, 83, again as known in the art. In such an application, it is possible to achieve a VSWR much better than 1.25:1, while retaining a low noise figure of below 2 dB, along with required stability and gain, even though losses of the hybrids are directly added to the noise figure in this arrangement.

It will be appreciated that the component values and circuitry just disclosed can be varied, modified, and adapted by those skilled in the art to achieve various embodiments, for example, meeting various circuit specifications and requirements for various applications. Therefore, it is to be understood that, within the scope of the appended claims, the invention may be practiced other than as specifically described herein.

What is claimed is:

1. An amplifier comprising:
   a field effect transistor means for operating in the microwave frequency range, said transistor means having a drain and a gate; and
   a parallel feedback network connected between the drain and gate of said transistor means and including a first resistor, a capacitor and a second resistor, the first resistor, capacitor and second resistor being connected in series, the values of the first and second resistors being selected to achieve a stability factor K greater than one for said amplifier over a multioctave range of frequencies.

2. The amplifier of claim 1 wherein said serially connected first resistor, second resistor and capacitor comprise a series circuit having first and second terminals, and wherein said parallel feedback network further includes a first filter means having a first terminal connected to said gate and a second terminal; and a second filter means having a first terminal connected to said drain and a second terminal; the second terminal of said first filter means being connected to the first terminal of said series circuit, and the second terminal of said second filter means being connected to the second terminal of said series circuit.

3. The amplifier of claim 2 wherein said first and second filter means attenuate noise generated in said feedback loop.

4. The amplifier of claim 3 wherein each said filter means comprises first and second transmission line sections.

5. The amplifier of claim 4 wherein each of said first and second transmission line sections is unequal in length to one-quarter wavelength.

6. The amplifier of claim 1 wherein said field effect transistor comprises a gallium arsenide field effect transistor.

7. An amplifier circuit comprising:
   a GaAs transistor having an input and an output;
   a feedback network connected between the output of said transistor and the input of said transistor, the feedback network including a series resistor-capacitor-resistor circuit;
   filter means for attenuating noise generated in said feedback network; and
   wherein said series resistor-capacitor-resistor circuit has first and second terminals and said filter means comprises a first filter network means connected between said first terminal and the input of said transistor and a second filter network means connected between said second terminal and the output of said transistor.

8. The amplifier circuit of claim 7 wherein each of said first and second filter network means includes a low impedance and a high impedance.

9. The amplifier circuit of claim 8 wherein the respective low and high impedances of each filter network means comprise a respective short and long transmission line section each unequal in length to one-quarter wavelength, said wavelength being determined by a selected frequency of operation of said amplifier circuit.

10. The amplifier of claim 9 wherein said GaAs transistor is a GaAs field effect transistor.

11. The amplifier of claim 9 wherein said GaAs transistor comprises a MESFET for operating in the microwave frequency range.

12. A gallium arsenide transistor amplifier comprising:
    a gallium arsenide transistor;
    a parallel feedback loop between the input and output of the gallium arsenide transistor; and
    means in said feedback loop for attenuating noise and for stabilizing said amplifier across a multioctave range of frequencies, said means comprising:

a resistor-capacitor-resistor series circuit means for stabilizing said amplifier; and first and second filtering network means for attenuating noise, the first said filtering network means being connected between said series circuit and the input of said transistor, and the second filtering network means being connected between said series circuit and the output of said transistor.

13. An amplifier comprising:

a gallium arsenide metal semiconductor transistor having an input and an output; and a parallel feedback network connected to said transistor between said input and output and having first and second transmission line filtering networks connected on opposite sides of a resistor-capacitor-resistor series circuit, the transmission line sections each including a low and a high impedance, each low and high impedance being unequal in length to one-quarter wavelength, said wavelength being determined at a selected center frequency of operation.

14. An amplifier comprising:

a field effect transistor means for operating in the microwave frequency range, said transistor means having a drain and a gate; and a parallel feedback network means connected between the drain and gate of said transistor means for feeding back to said gate a time varying signal and including a first resistor, a capacitor and a second resistor, the first resistor, capacitor and second resistor being connected in series, the values of the first and second resistors being selected to achieve a stability factor K greater than one for said amplifier over a multioctave range of frequencies.

15. The amplifier of claim 14 wherein said time varying signal is a microwave frequency signal.

* * * * *